(12) United States Patent
Fujiwara et al.

(10) Patent No.: US 8,338,954 B2
(45) Date of Patent: Dec. 25, 2012

(54) SEMICONDUCTOR APPARATUS AND FABRICATION METHOD THEREOF

(75) Inventors: Hitoshi Fujiwara, Shiojiri (JP); Takayasu Horasawa, Matsumoto (JP); Kenichi Kazama, Matsumoto (JP)

(73) Assignees: Fuji Electric Co., Ltd., Kawasaki-shi (JP); C. Uyemura & Co., Ltd., Osaka-shi (JP)

( * ) Notice: Subject to any disclaimer, the term of this patent is extended or adjusted under 35 U.S.C. 154(b) by 101 days.

(21) Appl. No.: 12/858,929

(22) Filed: Aug. 18, 2010

(65) Prior Publication Data

US 2011/0042816 A1    Feb. 24, 2011

(30) Foreign Application Priority Data

Aug. 20, 2009   (JP) ................ 2009-191502

(51) Int. Cl.
    *H01L 29/40*      (2006.01)
(52) U.S. Cl. ........ 257/766; 257/750; 257/765; 257/771; 257/E21.476; 257/E29.111

(58) Field of Classification Search .......... 257/766, 257/750, 765, 771, E21.476, E29.111
See application file for complete search history.

(56) References Cited

U.S. PATENT DOCUMENTS 6,028,011 A    2/2000   Takase et al.

FOREIGN PATENT DOCUMENTS

| JP | 406119872 | * | 4/1994 |
|----|-----------|---|--------|
| JP | 11-214421 A | | 8/1999 |
| JP | 2003-253454 A | | 9/2003 |
| JP | 2005-051084 A | | 2/2005 |

* cited by examiner

*Primary Examiner* — Long Pham
(74) *Attorney, Agent, or Firm* — Westerman, Hattori, Daniels & Adrian, LLP

(57) ABSTRACT

A semiconductor apparatus includes an aluminum electrode film formed on a semiconductor chip; and a nickel plated layer formed on the aluminum electrode film, wherein a concentration of sodium and potassium present in the nickel plated layer and at an interface between the nickel plated layer and the aluminum electrode film is $3.20 \times 10^{14}$ atoms/cm$^2$ or less.

1 Claim, 5 Drawing Sheets

FIG.2

| | WATER RINSE AFTER ZINCATE PLATING | Ni PLATING LIQUID COMPOSITION | | | | | | |
|---|---|---|---|---|---|---|---|---|
| | NUMBER OF WATER RINSE PROCESSES | NICKEL SULFATE | SODIUM HYPO-PHOSPHITE | AMMONIUM HYPO-PHOSPHITE | MALIC ACID | SODIUM CITRATE | AMMONIUM CITRATE | AQUEOUS AMMONIA |
| SPECIMEN 1 | 3 | 0.73 mol/L | 1.28 mol/L | 0.00 mol/L | 0.75 mol/L | 0.21 mol/L | 0.00 mol/L | ADJUSTED TO pH 5 |
| SPECIMEN 2 | 3 | 0.73 mol/L | 0.64 mol/L | 0.64 mol/L | 0.75 mol/L | 0.21 mol/L | 0.00 mol/L | ADJUSTED TO pH 5 |
| SPECIMEN 3 | 3 | 0.73 mol/L | 0.45 mol/L | 0.83 mol/L | 0.75 mol/L | 0.21 mol/L | 0.00 mol/L | ADJUSTED TO pH 5 |
| SPECIMEN 4 | 3 | 0.73 mol/L | 0.10 mol/L | 1.18 mol/L | 0.75 mol/L | 0.21 mol/L | 0.00 mol/L | ADJUSTED TO pH 5 |
| SPECIMEN 5 | 1 | 0.73 mol/L | 0.00 mol/L | 1.28 mol/L | 0.75 mol/L | 0.00 mol/L | 0.21 mol/L | ADJUSTED TO pH 5 |
| SPECIMEN 6 | 2 | 0.73 mol/L | 0.00 mol/L | 1.28 mol/L | 0.75 mol/L | 0.00 mol/L | 0.21 mol/L | ADJUSTED TO pH 5 |
| SPECIMEN 7 | 3 | 0.73 mol/L | 0.00 mol/L | 1.28 mol/L | 0.75 mol/L | 0.00 mol/L | 0.21 mol/L | ADJUSTED TO pH 5 |
| SPECIMEN 8 | 4 | 0.73 mol/L | 0.00 mol/L | 1.28 mol/L | 0.75 mol/L | 0.00 mol/L | 0.21 mol/L | ADJUSTED TO pH 5 |

FIG.3

| | WATER RINSE AFTER ZINCATE PLATING | Ni PLATING LIQUID COMPOSITION | | | | | |
|---|---|---|---|---|---|---|---|
| | NUMBER OF WATER RINSE PROCESSES | NICKEL SULFATE | BORIC ACID | AMMONIUM CHLORIDE | ROCHELLE SALT | DIMETHYL-AMINE-BORANE | AQUEOUS AMMONIA |
| SPECIMEN 9 | 3 | 0.19 mol/L | 0.49 mol/L | 0.56 mol/L | 0.21 mol/L | 0.06 mol/L | ADJUSTED TO pH 5 |

FIG.4

| | SURFACE AFTER ZINCATE PLATING AND WATER RINSE | IN PLATING SOLUTION | PLATING INTERFACE | TEST OF THRESHOLD VOLTAGE CHARACTERISTICS |
|---|---|---|---|---|
| | AMOUNT OF Na+K [atoms/cm$^2$] | AMOUNT OF Na+K [wtppm] | AMOUNT OF Na+K [atoms/cm$^2$] | DEFECTIVE PRODUCT [n=50] |
| SPECIMEN 1 | $1.82 \times 10^{13}$ | 8800 | $1.60 \times 10^{15}$ | 7/50 |
| SPECIMEN 2 | $1.60 \times 10^{13}$ | 5800 | $1.20 \times 10^{15}$ | 6/50 |
| SPECIMEN 3 | $1.75 \times 10^{13}$ | 5000 | $9.03 \times 10^{14}$ | 4/50 |
| SPECIMEN 4 | $1.62 \times 10^{13}$ | 3400 | $3.32 \times 10^{14}$ | 0/50 |
| SPECIMEN 5 | $2.60 \times 10^{20}$ | 1 | $8.80 \times 10^{14}$ | 3/50 |
| SPECIMEN 6 | $9.20 \times 10^{14}$ | 1 | $2.30 \times 10^{11}$ | 0/50 |
| SPECIMEN 7 | $1.82 \times 10^{13}$ | 1 | $2.80 \times 10^{11}$ | 0/50 |
| SPECIMEN 8 | $1.12 \times 10^{13}$ | 1 | $2.10 \times 10^{11}$ | 0/50 |
| SPECIMEN 9 | $1.78 \times 10^{13}$ | 5 | $3.20 \times 10^{11}$ | 0/50 |

FIG.5

| | SPEC-IMEN 1 | SPEC-IMEN 2 | SPEC-IMEN 3 | SPEC-IMEN 4 | SPEC-IMEN 5 | SPEC-IMEN 6 | SPEC-IMEN 7 | SPEC-IMEN 8 | SPEC-IMEN 9 |
|---|---|---|---|---|---|---|---|---|---|
| SPREAD PERCENTAGE [%] | 145 | 145 | 140 | 145 | 143 | 140 | 135 | 140 | 175 |

SEMICONDUCTOR APPARATUS AND FABRICATION METHOD THEREOF

BACKGROUND OF THE INVENTION

1. Field of the Invention

The embodiments discussed herein are related to a semiconductor apparatus and a method of fabricating the semiconductor apparatus.

2. Description of the Related Art

Generally, for a power semiconductor apparatus, surface electrodes formed on a surface of a semiconductor apparatus are connected by the wire bonding technique using aluminum wires. However, recently, the wire bonding technique has been replaced with a packaging technique that solders to the surface electrode a lead frame for electric wiring, an external electrode terminal or the like (hereinafter "bonding conductor").

A semiconductor apparatus has a problem in that when high current flows, the semiconductor apparatus generates a large amount of heat. Therefore, the bonding conductor works as a heat dissipater for releasing the heat and enhancing cooling efficiency and works as an interconnection for electrically connecting the semiconductor apparatus. Heat dissipation efficiency is ensured by giving a certain volume to the bonding conductor. For this reason, the area on the semiconductor apparatus for soldering the bonding conductor needs be large relative to the bonding conductor.

In such a semiconductor apparatus, on an aluminum (Al) electrode formed on the semiconductor apparatus, a nickel (Ni) layer and a gold (Au) layer are formed in this order, enabling the bonding conductor to be soldered on the aluminum electrode.

As a method for forming such nickel and gold layers, the following method has been proposed. In a semiconductor chip where a back electrode is connected to a circuit pattern on an insulating substrate and a front electrode is connected to a bonding conductor, an electrode film consisting of two layers (a nickel (Ni) layer and a gold (Au) layer deposited on the nickel layer) is formed, by an electroless plating method, on an aluminum (Al) layer forming the front electrode (see for example Japanese Laid-Open Patent Application No. 2005-051084).

Another method includes, in order to nickel-plate an aluminum electrode of a device as barrier metal or as a protruding electrode, a photo etching step for etching the device by acidic liquid or alkaline liquid, a zincate process step for performing a zincate process using an alkaline zincate solution, an activation step for activating a surface of the aluminum electrode by immersion of the aluminum electrode in an alkaline solution having a reducing agent, and an electroless nickel plating step for immersing the aluminum electrode in an electroless nickel plating solution of a redox reaction type with the reducing agent solution adhered to the aluminum electrode. As an electroless plating solution, an electroless Ni—P plating solution or an electroless Ni—B (boron) plating solution can be used. An alkaline plating solution using sodium hypophosphite as a reducing agent can also be used. As an electroless gold plating solution, generally, metal salt made from gold cyanide salt such as potassium dicyanoaurate (I) is used with potassium borohydride or dimethylamineborane (DMAB) being a reducing agent (see Japanese Laid-Open Patent Application No. H11-214421).

Through extensive research, the inventors have newly identified the following. If electroless nickel plating is performed using an electroless Ni—P plating solution having sodium hypophosphite as a reducing agent, such as the example given in Japanese Laid-Open Patent Application No. H11-214421, sodium (Na) in the electroless Ni—P plating solution remains in the nickel plating layer and at the interface between the nickel plating layer and the aluminum electrode. This sodium passes through the aluminum electrode and diffuses into the semiconductor substrate consequent to, for example, heat treatment such as soldering during the mounting of the fabricated semiconductor chip. As a result, the threshold voltage (Vth) characteristics of the semiconductor apparatus degrades.

SUMMARY OF THE INVENTION

It is an object of the present invention to at least solve the above problems in the conventional technologies.

A semiconductor apparatus according to one aspect of the invention includes an aluminum electrode film formed on a semiconductor chip; and a nickel plated layer formed on the aluminum electrode film, where a concentration of sodium and potassium present in the nickel plated layer and at an interface between the nickel plated layer and the aluminum electrode film is $3.20 \times 10^{14}$ atoms/cm$^2$ or less.

Other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a diagram illustrating liquid composition of an electroless Ni—P plating bath for a fabrication method of the semiconductor apparatus;

FIG. 3 is a diagram illustrating liquid composition of the electroless Ni—B plating bath for the fabrication method of the semiconductor apparatus;

FIG. 4 is a diagram illustrating a relationship between a Na+K concentration and threshold voltage characteristics of the semiconductor apparatus according to the embodiments; and FIG. 5 is a diagram illustrating a result of evaluation of the solder wetting characteristics of the semiconductor apparatus according to the embodiments.

DETAILED DESCRIPTION OF THE PREFERRED EMBODIMENTS

Figure 1:
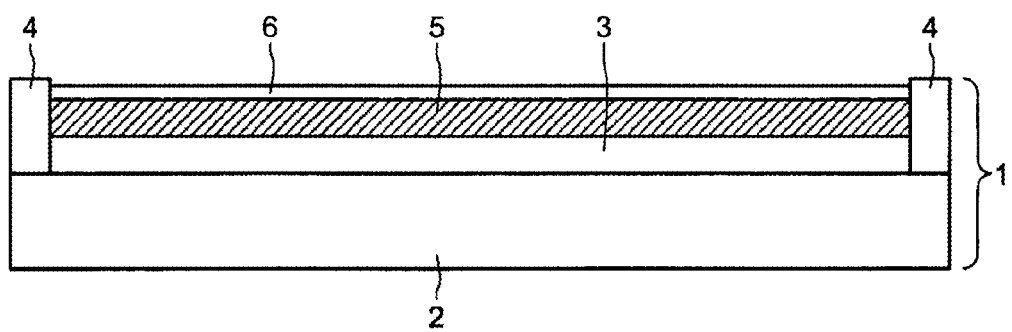
FIG. 1 is cross-sectional view of a semiconductor apparatus according to an embodiment.

Preferred embodiments of the present invention will be explained with reference to the accompanying drawings. Like components in the embodiments and drawings are indicated by the same reference numeral.

FIG. 1 is cross-sectional view of a semiconductor apparatus according to an embodiment. In a semiconductor apparatus 1 of FIG. 1, an aluminum electrode 3 is formed on a semiconductor substrate 2. A nickel plated layer 5 is formed on the aluminum electrode 3. A gold plate layer 6 is formed on the nickel plated layer 5. On a peripheral part of the semiconductor substrate 2, a pressure resisting unit 4 made of, for example, polyimide film, is formed. In an actual semiconductor apparatus, various p-type regions or n-type regions may be formed in the semiconductor substrate 2. An electrode made up of the aluminum electrode 3, the nickel plated layer 5, and the gold plate layer 6 may work as an anode electrode, a cathode electrode, an emitter electrode, or a source electrode, and undergoes a patterning process to have a given shape.

A method of fabricating an electrode part will be explained. The aluminum electrode 3 is deposited on the semiconductor substrate 2. Particles or organic impurities on the semiconductor substrate 2 are removed by cleaning with a cleaner using ultrasonic or plasma or by cleaning with etching. As pre-treatment for an electroless nickel plating process, a zincate plating process is performed on the semiconductor substrate 2. After the cleaning and the zincate plating process, the semiconductor substrate 2 is cleaned with water.

An electroless nickel plating process is performed and the nickel plated layer 5 is formed on the aluminum electrode 3. A general electroless gold plating process is performed and the gold plate layer 6 is formed on the nickel plated layer 5. The surface of the gold plate layer 6 is dried by, for example, the spin drying making use of centrifugal force. Through the processes explained above, the semiconductor apparatus 1 is fabricated.

At the water rinse process after the zincate plating process, it is preferable to clean the semiconductor substrate 2 with, for example, ultra pure water until the sum of concentrations of (a concentration of) sodium and potassium (first Na+K concentration) remaining on the aluminum electrode 3 becomes equal to or less than $9.20 \times 10^{14}$ atoms/cm$^2$, the reason of which will be explained below. An identical condition may be applied to other water rinse processes.

At the electroless nickel plating process, an electroless nickel plating bath of a lower sodium content than that in a conventional method is used. Here, it is preferred for a concentration (second Na+K concentration) of element of sodium and potassium in the plating bath to be equal to or less than 3400 wtppm, the reason of which will be explained later.

One example of the electroless nickel plating bath is an electroless Ni—P plating bath in which ammonium hypophosphite is added as a reducing agent to nickel sulfate (NiSO$_4$), the reason of which will be explained later. As a complexing agent for forming a complex of a Ni$^+$ ion in the plating bath, one or more of malic acid (C$_4$H$_6$O$_5$), sodium citrate (Na$_3$(C$_6$H$_5$O$_7$).2H$_2$O) and ammonium citrate may be added. Ammonium citrate instead of sodium citrate can reduce more sodium in the electroless Ni—P plating bath. In order to control a pH value in the plating bath, aqueous ammonia (NH$_3$) may be added. Like a conventional technique, an electroless Ni—P plating bath using sodium hypophosphite as a reducing agent may be used. In such a case, liquid composition that reduces sodium in the electroless Ni—P plating bath is preferred.

As another example of the electroless nickel plating bath, an electroless Ni—B plating bath where a boron compound such as dimethylamine-borane (DMAB) is added as a reducing agent into nickel sulfate is preferred, the reason of which will be explained later. In the electroless Ni—B plating bath, ammonium chloride (NH$_4$Cl), Rochelle salt functioning as a complexing agent, or boric acid (H$_3$BO$_3$) functioning as a pH buffer may be added. A pH value may be controlled in a manner similar to the electroless nickel plating bath.

By the electroless nickel plating method, the nickel plated layer 5 can be deposited at an arbitrary position on the aluminum electrode 3. For example, a plating process is performed avoiding forming the nickel plated layer 5 on the pressure resisting unit 4. By the electroless gold plating method, as the electroless nickel plating method, the gold plate layer 6 can be formed at an arbitrary position on the nickel plated layer 5.

FIG. 2 is a diagram illustrating liquid composition of the electroless Ni—P plating bath for a fabrication method of the semiconductor apparatus. FIG. 3 is a diagram illustrating liquid composition of the electroless Ni—B plating bath for the fabrication method of the semiconductor apparatus. According to the embodiments explained above, two wafers are processed simultaneously and two semiconductor apparatuses 1 depicted in FIG. 1 are fabricated. To fabricate the semiconductor apparatus 1, the aluminum electrode 3 and the pressure resisting unit 4 are formed on the semiconductor substrate 2. The various cleaning processes and the zincate plating process are performed. After the cleaning and the zincate plating processes, a surface of the semiconductor substrate 2 is cleaned with water.

With one of the semiconductor apparatuses 1, a quantitative analysis of the first Na+K concentration is performed. With respect to the other semiconductor apparatus 1, after the nickel plated layer 5 and the gold plate layer 6 are formed on the aluminum electrode 3 in this order, a quantitative analysis of concentration (third Na+K concentration) of sodium and potassium that remain in the nickel plated layer 5 and at the interface between the nickel plated layer 5 and the aluminum electrode 3 is performed. To form the nickel plated layer 5, an electroless nickel plating bath prepared at 80° C. and pH 5 is used. Thickness of the nickel plate player 5 is controlled to be 5 μm. A drying process is performed on the gold plate layer 6. A quantitative analysis of the second Na+K concentration is performed in the electroless nickel plating bath that is used for the fabrication of the specimens. Each Na+K concentration is measured by inductively coupled plasma mass spectrometry (ICPMS).

As depicted in FIG. 2 and FIG. 3, the number of water rinse processes after the zincate plating process and the liquid composition of the electroless plating bath are altered to repeatedly fabricate the semiconductor apparatus 1 and obtain specimens 1 through 9.

In the above water rinse processes, the following processes are performed. The semiconductor substrate 2 is placed in a rinse tank that can rinse substrates at two liters (L) per one substrate. The semiconductor substrate 2 is immersed in deionized water of at least 18MΩ for about one minute. This process is repeated 1 to 4 times changing all of the deionized water to meet fabrication conditions for each specimen. Then the surface of the semiconductor substrate 2 is rinsed with ultra pure water at a flow of 10 L/min for 10 seconds.

As the electroless nickel plating bath, the electroless Ni—P plating bath or the electroless Ni—B plating bath is used. The liquid composition of the electroless Ni—P plating bath is as follows: nickel sulfate 0.73 mol/L; sodium hypophosphite 0.00-1.28 mol/L; ammonium hypophosphite 0.00-1.28 mol/L; malic acid 0.75 mol/L; sodium citrate 0 mol/L or 0.21 mol/L; ammonium citrate 0 mol/L or 0.21 mol/L; and a moderate amount of aqueous ammonia. The liquid composition of the electroless Ni—B plating bath is as follows: nickel sulfate 0.19 mol/L; boric acid 0.49 mol/L; ammonium chloride 0.56 mol/L; Rochelle salt 0.21 mol/L; dimethylamine-borane 0.06 mol/L; and a moderate amount of aqueous ammonia. Aqueous ammonia is added so that by the amount of added aqueous ammonia, the plating bath has the pH of 5. The amounts of sodium hypophosphite, ammonium hypophosphite, sodium citrate, and ammonium citrate varies according to specimen.

For specimens 1 to 4, the electroless Ni—P plating bath having sodium hypophosphite and ammonium hypophosphite as reducing agents is used. For specimens 1 to 4, the liquid composition of the electroless Ni—P plating bath is changed but the number of water rinse processes after the zincate plating process is fixed. In the electroless Ni—P plating bath, the sum of amounts of sodium hypophosphite and ammonium hypophosphite is 1.28 mol/L (the amount of sodium hypophosphite≠0.00). Malic acid and sodium citrate are added as complexing agents. Ammonium citrate is not added. The water rinse process after the zincate plating process is conducted three times.

For specimens 5 to 8, the electroless Ni—P plating bath having ammonium hypophosphite as a reducing agent is used. For specimens 5 to 8, the liquid composition of the electroless Ni—P plating bath is fixed but the number of water rinse processes after the zincate plating process varies. In the electroless Ni—P plating bath, sodium hypophosphite is not added (the amount of sodium hypophosphite=0.00) but ammonium hypophosphite is added 1.28 mol/L. Malic acid and ammonium citrate are added as complexing agents. Sodium citrate is not added.

For specimen 9, the electroless Ni—B plating bath having dimethylamine-borane as a reducing agent is used. The water rinse process after the zincate plating process is repeated three times. For all specimens 1 to 9, excluding the water rinse following the zincate plating process, water rinse is performed three times, the method of which is identical to that of the water rinse conducted after the zincate plating process.

For specimens 1 to 9 fabricated as explained above, a threshold voltage characteristics test is performed. FIG. 4 is a diagram illustrating a relationship between a Na+K concentration and threshold voltage characteristics of the semiconductor apparatus according to the embodiments. FIG. 4 depicts the first Na+K concentration (the amount of Na+K on the surface after the zincate plating and the water rinse), the second Na+K concentration (the amount of Na+K in the plating solution), the third Na+K concentration (the amount of Na+K on the plate interface), and the number of defective products. As depicted in FIG. 4, the smaller the number of defective products (the smaller the numerator) is, the better the threshold voltage characteristics are. Namely, specimens 4 and 6 to 9 for which the number of defective products equals to 0/50 prevent degradation of the threshold voltage characteristics of the semiconductor apparatus. Therefore, to form the nickel plated layer, an electroless nickel plating bath in which the sum of concentrations of sodium hypophosphite and sodium citrate is lower is preferable and thus, an electroless Ni—B plating bath or an electroless Ni—P plating bath having ammonium hypophosphite as an addition agent is preferable.

As can be from FIG. 4, when the residual concentration (the third Na+K concentration) of sodium and potassium in the nickel plated layer 5 and at the interface between the nickel plated layer 5 and the aluminum electrode 3 is at most $3.32 \times 10^{14}$ atoms/cm$^2$, the degradation of the threshold voltage characteristics of a semiconductor apparatus is prevented (see specimen 4 in FIG. 4). The third Na+K concentration can be controlled by adjusting the first Na+K concentration and the second Na+K concentration. As a result, it is preferable that the residual concentration (the first Na+K concentration) of sodium and potassium on the surface of the aluminum electrode 3 is at most $9.20 \times 10^{14}$ atoms/cm$^2$ (see specimen 6 in FIG. 4). Further, through two or more water rinse processes described above, a desirable first Na+K concentration is obtained. Furthermore, it is preferable that the concentration (the second Na+K concentration) of sodium and potassium in the electroless nickel plating bath is at most 3400 wtppm (see specimen 4 in FIG. 4).

For specimens 1 to 9, solder wetting characteristics are evaluated. FIG. 5 is a diagram illustrating a result of evaluation of the solder wetting characteristics of a semiconductor apparatus according to the embodiments. Solder on the surface of the semiconductor apparatus 1 is heated and melted and the spread of the solder is measured. A tin(Sn)-silver (Ag)-copper(Cu) solder plate having 3 mm diameter is used. The test is conducted five times (n=5). An area of the solder plate is defined to be 100% and an area of melted solder plate is measured. A spread ratio in FIG. 5 is the average of five tests. As can be seen from FIG. 5, the spread ratio of specimen 9 is larger than the other specimens and thus, the solder wetting characteristics of the semiconductor apparatus is enhanced with the electroless Ni—B plating bath.

According to the embodiments, the concentration (the first Na+K concentration) of sodium and potassium on the surface of the aluminum electrode 3 before the nickel plated layer 5 is formed is adjusted to be at most $9.20 \times 10^{14}$ atoms/cm$^2$. The concentration (the second Na+K concentration) of sodium and potassium in the electroless nickel plating bath for forming the nickel plated layer 5 is adjusted to be at most 3400 wtppm. As a result, for a semiconductor substrate before a bonding conductor is jointed by solder, the residual concentration (the third Na+K concentration) of sodium and potassium in the nickel plated layer 5 and in the interface between the nickel plated layer 5 and the aluminum electrode 3 can be reduced to $3.20 \times 10^{14}$ atoms/cm$^2$ or less. Reducing the third Na+K concentration prevents sodium from diffusing into the semiconductor substrate by heat treatment at subsequent semiconductor chip implementation processes. Degradation of the threshold voltage characteristics of the semiconductor apparatus can also be prevented. With the electroless Ni—B plating bath using a boron compound such as dimethylamine-borane as a reducing agent, the solder wetting characteristics on the surface of the semiconductor apparatus is enhanced.

Using an electroless plating method to form a nickel plate player, a nickel plated layer having excellent coating characteristics (for instance, corrosion resistance, hardness) can be formed as in Japanese Laid-Open Patent Application Nos. 2005-051084 and H11-214421. Control of the plating bath also becomes easier.

Numerical values herein for the water rinse processes and the liquid composition of the water rinse processes and the electroless nickel plating bath are examples and can be modified. The embodiments can also be applied to a back electrode of a semiconductor apparatus as well as a front electrode formed on a front surface of a semiconductor apparatus.

This application is based upon and claims the benefit of priority of the prior Japanese Patent Application No. 2009-191502, filed on Aug. 20, 2009, the entire contents of which are incorporated herein by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor apparatus comprising:
    an aluminum electrode film formed on a semiconductor chip; and
    a nickel plated layer formed on the aluminum electrode film, wherein
    a concentration of sodium and potassium present in the nickel plated layer and at an interface between the nickel plated layer and the aluminum electrode film is $3.20 \times 10^{14}$ atoms/cm$^2$ or less.

* * * * *